(12) United States Patent
Amon et al.

(10) Patent No.: US 6,967,133 B2
(45) Date of Patent: Nov. 22, 2005

(54) METHOD FOR FABRICATING A SEMICONDUCTOR STRUCTURE

(75) Inventors: Jürgen Amon, Dresden (DE); Jürgen Faul, Radebeul (DE); Ulrike Gruening, München (DE); Frank Jakubowski, Dresden (DE); Thomas Schuster, Dresden (DE); Rudolf Strasser, Hsin Chu (TW)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/696,159

(22) Filed: Oct. 29, 2003

(65) Prior Publication Data

US 2004/0115874 A1  Jun. 17, 2004

(30) Foreign Application Priority Data

Oct. 31, 2002  (DE) ................................ 102 50 872

(51) Int. Cl.$^7$ ........................................ H01L 21/8238
(52) U.S. Cl. ...................... 438/230; 438/251; 438/250; 438/229; 257/300
(58) Field of Search ......................................... 438/230

(56) References Cited

U.S. PATENT DOCUMENTS

| | | | |
|---|---|---|---|
| 6,211,007 B1 * | 4/2001 | Prall et al. .................. | 438/253 |
| 6,403,423 B1 * | 6/2002 | Weybright et al. .......... | 438/279 |
| 6,444,548 B2 * | 9/2002 | Divakaruni et al. ........ | 438/525 |
| 2002/0100930 A1 * | 8/2002 | Yeagashi .................... | 257/315 |

FOREIGN PATENT DOCUMENTS

| | | |
|---|---|---|
| DE | 195 27 146 A1 | 1/1997 |
| DE | 198 60 769 A1 | 7/1999 |

* cited by examiner

*Primary Examiner*—Thao P. Le
(74) *Attorney, Agent, or Firm*—Jenkins, Wilson & Taylor, P.A.

(57) ABSTRACT

The present invention provides a method for fabricating a semiconductor structure having a plurality of gate stacks (GS1, GS2, GS3, GS4) on a semiconductor substrate (10), having the following steps: application of the gate stacks (GS1, GS2, GS3, GS4) to a gate dielectric (11) above the semiconductor substrate (10); formation of a sidewall oxide (17) on sidewalls of the gate stacks (GS1, GS2, GS3, GS4); application and patterning of a mask (12) on the semiconductor structure; and implantation of a contact doping (13) in a self-aligned manner with respect to the sidewall oxide (17) of the gate stacks (GS1, GS2) in regions not covered by the mask (12).

15 Claims, 3 Drawing Sheets

METHOD FOR FABRICATING A SEMICONDUCTOR STRUCTURE

TECHNICAL FIELD

The present invention relates to a method for fabricating a semiconductor structure and, in particular, to a method for fabricating a semiconductor structure having a plurality of gate stacks on a semiconductor substrate.

BACKGROUND ART

In the fabrication of DRAM modules, the array contacts are typically etched only after the deposition of an ILD layer or mask in the fabrication process. If metallic bit line contacts, for example a tungsten contact on silicon (CB), are then used, a contact hole implantation is additionally required for lowering the contact resistance between the semiconductor material and the metal. This implantation requires a separate photolithographic mask step, in which, after the etching of all the contact holes (not only the CB contact holes), all the other contact holes, such as CSN and CSP, in the peripheral circuits are covered and, consequently, only the CB contact holes are not covered by the mask and are thus accessible for the implantation. In other words, the implantation of a CB contact requires a cost-causing mask step (YA) in which the other contact types CSN and CSP are covered.

Selection transistors in the cell array of a DRAM module, also called cell transistors, generally have large connection resistances, in particular high resistances of the source/drain regions. This is due to the fact that high dopant concentrations or a siliconization, for example, are required for producing low connection resistances. Both have appeared to be impossible heretofore in the cell array. On the one hand, siliconizations are not used at the present time in the DRAM selection transistor array for cost reasons. High dopant concentrations in the source/drain region, on the other hand, lead, in the case of transistors having structural dimensions of smaller than 200 nm, to high dopant gradients which result in high electric fields between the source/drain region and an underlying well region. High electric fields in turn cause increased leakage currents and thus short retention times of the signal or level stored in the memory cell. A large connection resistance, which is essentially composed of the contact resistance and the resistance of the source diffusion region, in turn entails the risk of a loss of module performance on account of lower saturation currents.

A conventional planar semiconductor structure is illustrated for elucidation purposes with reference to FIG. 3. A first gate stack GS1 and a second gate stack GS2 are arranged on a semiconductor substrate 10 with a passivation 11 formed thereon. A gate stack GS1, GS2 is in each case patterned in such a way that a polysilicon structure 14 is arranged on an oxide 11, said polysilicon structure being followed by an identically patterned metal silicide layer 15. These two gate stack layers 14, 15 are provided with a sidewall oxide 17 at their sidewalls. In the vertical direction toward the top, the metal silicide 15 is followed by a silicon nitride structure 16, which also extends over the sidewall oxide structure 17. Finally, the gate stack structure GS1, GS2 is laterally enclosed at its sidewall either with an SiON or SiN layer 19. In the semiconductor substrate 10, in particular between the gate stacks GS1, GS2, a lightly doped region 18 having a dopant concentration of, for example, $10^{19}$–$10^{20}$/cm$^3$ (dose of the implantation $10^{13}$–$6·10^{13}$/cm$^2$), e.g. made of phosphorus, is provided, which is implanted before or after the formation of the sidewall oxide 17. This lightly doped drain (LDD) region 18 essentially extends in each case between the junctions of the gate stack sidewalls with respect to the sidewall oxide 17 thereof and provide an increased connection resistance on account of the low doping concentration.

In order to provide a contact hole implantation 13 in the case of a metallic CB contact, for example with an ion implantation of $10^{14}$–$10^{15}$/cm$^2$, the entire semiconductor structure is provided with a mask (YA) (not illustrated), for example an ILD resist, which is patterned in such a way that only the CB contact openings between the SiN or SiON covering walls and/or side walls 19 are not covered by the mask, whereas the CSN and CSP contacts in the periphery (not illustrated) are masked with the resist. YA is a so-called block mask (not illustrated), whereas the structure with a BPSG layer 12a and an overlying TEOS layer 12b in accordance with FIG. 3 results from the patterning of the contact holes (CSN, CSP, CB). In order to produce a low CB contact resistance, it is possible, then, to form the contact implantation through the CB contact hole—not concealed by the resist—through a doping 13 and thus provision of a high contact dopant concentration.

If contact is subsequently to be made via a metallic contact (not illustrated), for example made of tungsten, then such a CB contact implantation is customary and essential for setting a low contact resistance. What is disadvantageous in this case is that a CB contact implantation 13 requires a separate photolithographic step since firstly all three contact hole types (CB, n-type (CSN) and p-type (CSP) contacts) are uncovered simultaneously, but all of them except for the CB contact holes are to be covered by a mask 12 before the implantation. Furthermore, the effectiveness of reducing the resistance by means of the contact hole implantation 13 is dependent on the CB dimensioning and the lateral distance d between the CB contact and the gate stack edge. If said distance d becomes too small, the contact implantation 13 influences the threshold voltage of the transistor if the distance X3 between the gate edge and the high contact hole implantation 13 becomes too small. If the distance d becomes too large, the connection resistance rises. What is problematic, then, is that the contact implantation 13 is not effected in a self-aligned manner with respect to the gate edge, i.e. with respect to the transistor, but rather is dependent on the CB contact hole etching, i.e. the CB contact hole dimension.

Instead of a metallization for providing the contact in the contact hole, it is additionally possible to provide a contact made of a polysilicon, i.e. highly doped poly-Si on x-Si. In this case, a dopant (phosphorus, arsenic) is outdiffused from (highly) doped polysilicon. What is problematic in this case, however, is that the outdiffusion of the dopant from the polysilicon is difficult to control since it is necessary to control the doping content in the polysilicon. Moreover, the outdiffusion must be neither too strong nor too weak, and, in addition, it is necessary to take account of restrictions on thermal budget after the introduction of the polysilicon filling (not illustrated) into the contact hole. Particularly in the context of increasing shrinking, i.e. in the context of advancing minimization of dimensioning, the thermal budget of the subsequent thermal steps is restricted to a very great extent by the smaller lateral distance d between the CB contact and the gate edge.

SUMMARY OF THE INVENTION

It is an object of the present invention to provide a method for fabricating a semiconductor structure having a plurality of gate stacks on a semiconductor substrate by means of which the connection resistance of the selection transistors is kept low whilst simplifying the fabrication process.

According to the invention, this object is achieved by means of the method for fabricating a semiconductor structure having a plurality of gate stacks on a semiconductor substrate as specified in claim 1.

The idea on which the present invention is based essentially consists in saving a mask or a resist plane in the fabrication process and correspondingly carrying out both a so-called "single-sided halo implant" for the selection transistor in the cell array and the contact hole implantation for a CB contact with a single mask plane (GA plane). This combination of two implantations formerly with two required resist planes (GA plane and YA plane) to form a single plane (GA plane) makes it possible to realize, on the CB side, extremely low connection resistances or series resistances for the selection transistors in the cell array, for example of a DRAM, without jeopardizing or reducing the retention time of the cell signal, preferably stored in a storage capacitance.

In the present invention, the problem mentioned in the introduction is solved in particular by providing a method for fabricating a semiconductor structure having a plurality of gate stacks on a semiconductor substrate, having the following steps: application of the gate stacks to a gate dielectric above the semiconductor substrate; formation of a sidewall oxide on sidewalls of the gate stacks; application and patterning of a mask on the semiconductor structure; and implantation of a contact doping in a self-aligned manner with respect to the sidewall oxide in regions not covered by the mask.

The invention is characterized in particular in setting a very low sheet resistance on the source side of the selection transistor, i.e. on the side of the CB contact, by means of a suitable n-type ion implantation having a high dose, for example $10^{14}$–$3 \cdot 10^{15}$/cm$^2$, preferably with arsenic. For this purpose, use is made of a mask plane (GA) which has actually already been created for carrying out a single-sided p-type halo implantation and has already been patterned in such a way that it opens the bit line side of the selection transistor.

What is advantageous in this case is that the n-type implantation is effected in a self-aligned manner with respect to the gate edge or with respect to the gate oxide and ensures an extremely low connection resistance of the selection transistor. Furthermore, an implantation through the finished CB contact hole (gate stack also laterally encapsulated already with SiN) can be obviated since this n-type implantation provided in a self-aligned manner with respect to the gate edge ensures a low contact resistance of the CB contact, as a result of which a complete photolithographic plane, for example in 110 nm technology, can be obviated.

Furthermore, this invention affords the possibility of spatially separating the position of a bit line halo implant from the high-dose contact hole implantation. For this purpose, it is possible firstly to carry out the contact hole implantation and place the corresponding contact hole implant, in which case the associated halo implant is then placed after an oxide stripping at the bit line side of the array transistor. In addition, on account of the then more favorable aspect ratio, it is then possible to place the halo implant at larger angles and thus increase its efficiency. Moreover, after the side oxide stripping after the removal of the mask (GA), it is possible to place an expansion LDD implant for the array device (spatial separation of HDD and LDD implant in the array transistor).

Advantageous developments and improvements of the subject matter of the invention are found in the subclaims.

In accordance with one preferred development, after the implantation of the contact doping, the sidewall oxide is reduced in its lateral extent in regions not covered by the mask.

In accordance with a further preferred development, the reduction of the extent of the lateral sidewall oxide is followed by a further implantation of different doping.

In accordance with a further preferred development, the further doping is a p-type doping having a low concentration, preferably with a dopant concentration that is at least a power of ten lower than the contact doping concentration.

In accordance with a further preferred development, the further doping is a bit line halo doping implanted from a predetermined direction at a predetermined angle, preferably in the range of between 0° and 30° inclusive.

In accordance with a further preferred development, the contact doping is implanted at a predetermined angle of $\alpha=0°$.

In accordance with a further preferred development, the contact doping is an n-type doping having a high concentration, which is produced by means of an ion implantation of about $10^{14}$–$3 \cdot 10^{15}$/cm$^2$, preferably with arsenic.

In accordance with a further preferred development, a removal of the mask is followed by an implantation of a, preferably identical, dopant having a lower dopant concentration than that of the contact doping.

In accordance with a further preferred development, the gate stacks are applied approximately equidistantly with respect to one another, a storage capacitor being arranged alternately below every third or first adjacent gate stack in the semiconductor substrate in a cross-sectional plane.

In accordance with a further preferred development, the method is used for fabricating logic transistors.

In accordance with a further preferred development, the method is used for fabricating selection transistors, preferably of a DRAM.

In accordance with a further preferred development, the gate stacks are fabricated with a length of less than 200 nm.

In accordance with a further preferred development, the gate stacks have a lower first layer made of polysilicon and an overlying second layer made of a metal silicide or a metal.

In accordance with a further preferred development, the gate stacks are created by carrying out an application and patterning of the first layer, the overlying second layer and a third layer arranged thereon on the gate dielectric.

In accordance with a further preferred development, the third layer has silicon nitride or oxide.

An exemplary embodiment of the invention is illustrated in the drawings and explained in more detail in the description below.

DETAILED DESCRIPTION OF THE INVENTION

In the figures, identical reference symbols designate identical or functionally identical constituent parts.

Figure 1A:
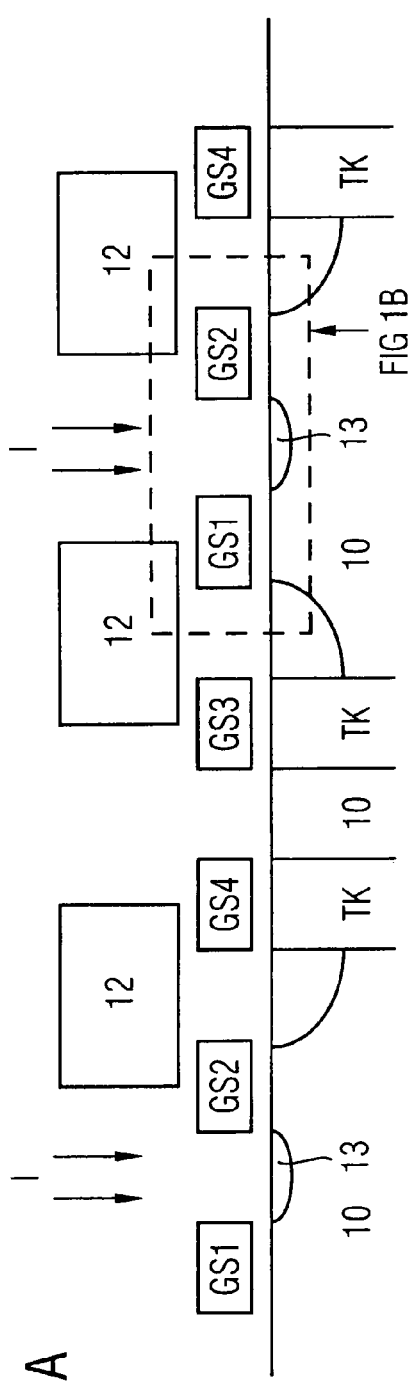
FIGS. 1A, B show a diagrammatic cross-sectional view of a semiconductor structure for elucidating an embodiment of the present invention, FIG. 1A illustrating a larger detail and FIG. 1B illustrating the dashed rectangle in FIG. 1A in an enlarged view.

FIG. 1A diagrammatically illustrates a cross section of a DRAM semiconductor structure in a larger detail. A plurality of gate stacks GS1, GS2, GS3 and GS4 are arranged, preferably equidistantly, on a semiconductor substrate 10, a storage capacitor TK for storing an information item, i.e. an electrical charge, being arranged below every third or first gate stack GS3, GS4 in a cross-sectional plane. The gate stacks GS1 to GS4 are preferably patterned identically, provided in a plurality and are described in more detail with reference to FIG. 1B. A mask 12 is illustrated diagrammatically above the interspace between the gate stack GS3 and GS1 and between GS2 and GS4, so that the region between the gate stack GS1 and the gate stack GS2 is not covered by the mask 12 and an implantation I can be effected there, so that a section 13 provided with a doping is formed in the semiconductor substrate 10.

Figure 1B:
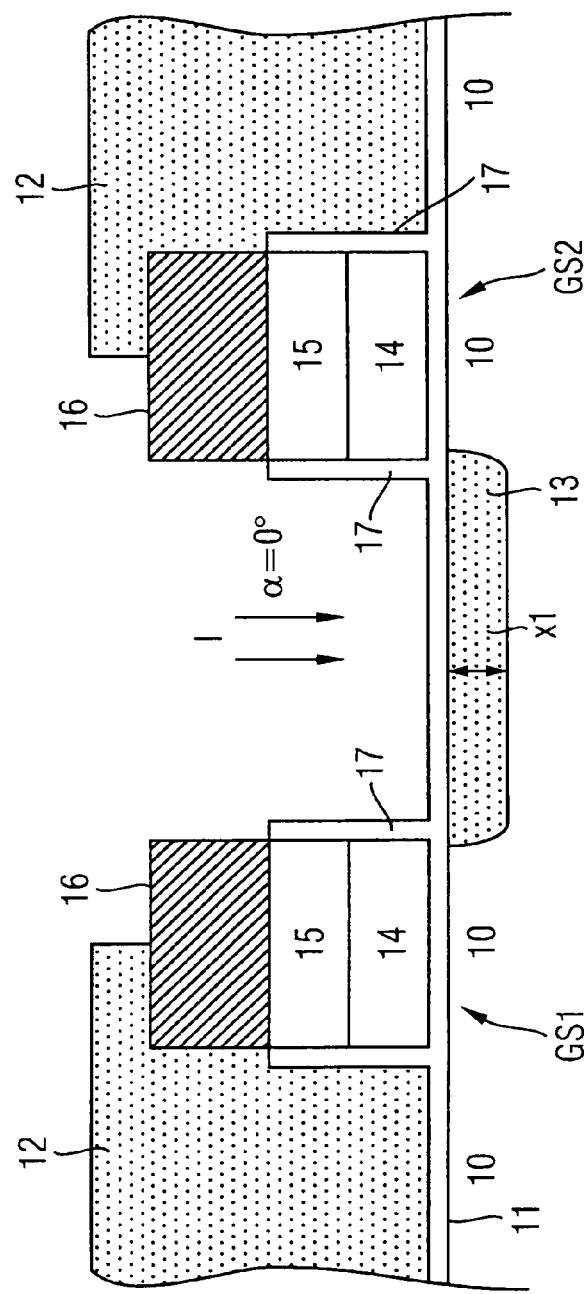

FIG. 1B shows a detail enlargement of the content of the dashed rectangle in accordance with FIG. 1A. On a semiconductor substrate 10, a dielectric 11 is provided for passivating the substrate surface. The passivation layer 11 preferably has an oxide. In the vertical direction toward the top, there follow in predetermined sections a first gate stack GS1 and a second gate stack GS2, which are essentially constructed such that they are patterned identically. On the semiconductor passivation 11, in order to produce the gate stacks GS1, GS2, a polysilicon layer 14 is applied, followed by a metal silicide 15 or a metal. A silicon nitride layer 16 (SiN) preferably follows in the vertical direction toward the top. The individual layers 14, 15 and 16 of the gate stacks GS1, GS2 are patterned in such a way that the layers 14, 15 and 16 lying one on top of the other are approximately congruent in plan view. The individual gate stacks GS1 and GS2 preferably run in strip-like fashion and parallel as viewed in the plane of the drawing.

The patterning of the gate stacks GS1, GS2 with the corresponding layers 14, 15 and 16 is followed by an oxidation of the gate stack sidewalls of the polysilicon layer 14 and of the metal silicide layer 15 and thus formation of a sidewall oxide 17. A mask 12 preferably made of a resist that can be processed photolithographically is thereupon applied to the semiconductor structure and patterned in such a way that an opening is formed approximately between the center of the first gate stack GS1 and of the second gate stack GS2.

This is followed by an ion implantation from a predetermined implantation direction I, for example at the implantation angle $\alpha=0°$, preferably with arsenic, i.e. with n-type ions. The n-type ion implantation 13 has a high dose of about $10^{14}$–$3\cdot10^{15}$/cm$^2$ in a predetermined vertical extent x1 in the semiconductor substrate 10. Consequently, an n-type implantation 13 which is self-aligned with respect to the gate edge with respect to the gate sidewall oxide 17 is effected after the provision of the sidewall oxide 17, the implantation being effected only on the CB side (bit line contact) of the selection transistor on account of the mask 12. In this way, an extremely low sheet resistance is ensured in a self-aligned manner with respect to the gate edge and an additional variation of the threshold voltage and of the connection resistance is prevented as a result. This results in a better performance of the selection transistor since a higher saturation current can be achieved. Since the HDD (highly doped drain) implantation is effected only on the CB side, there is no influence on the retention time of the charge in the storage capacitors TK.

Figure 2A:
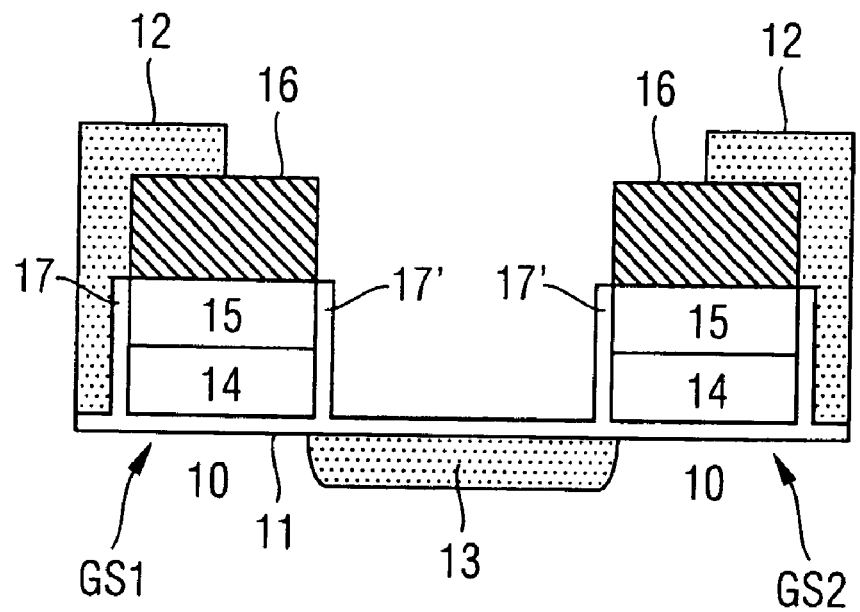
FIGS. 2A, B show a diagrammatic cross-sectional view of a semiconductor structure for elucidating successive steps in the fabrication process in accordance with an embodiment of the present invention.

FIG. 2A illustrates the arrangement in accordance with FIG. 1B after a succeeding process step. In accordance with FIG. 2A, in the region of the contact hole implantation (CB contact) not covered by the mask 12, the sidewall oxide 17 has been thinned, i.e. reduced in its lateral extent compared with the lateral extent of the sidewall oxide 17, thereby forming a thinned sidewall oxide 17'. This thinning of the sidewall oxide 17 is preferably effected in an etching step.

Figure 2B:
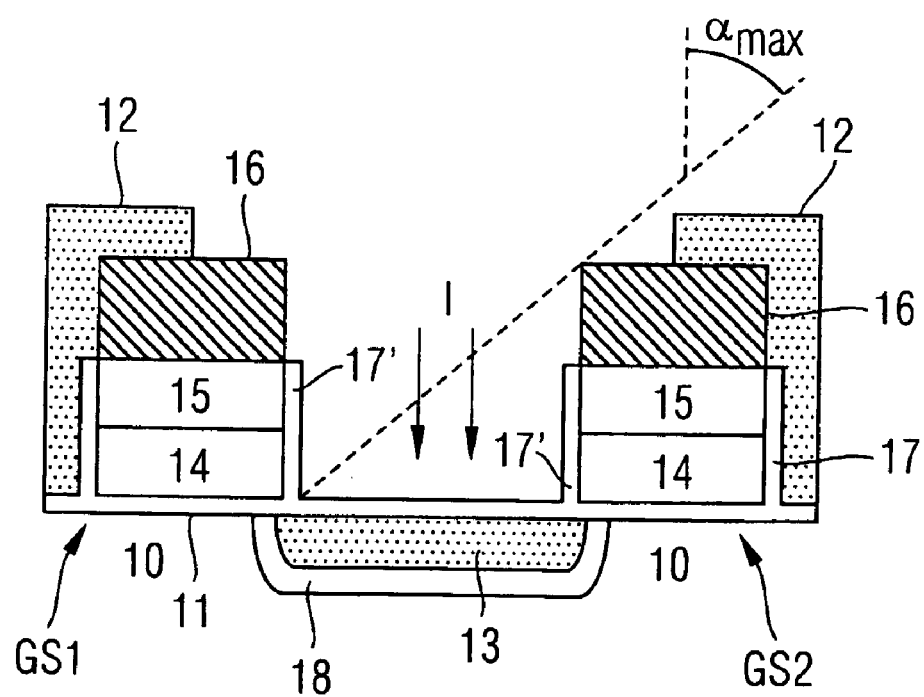
Figure 3:
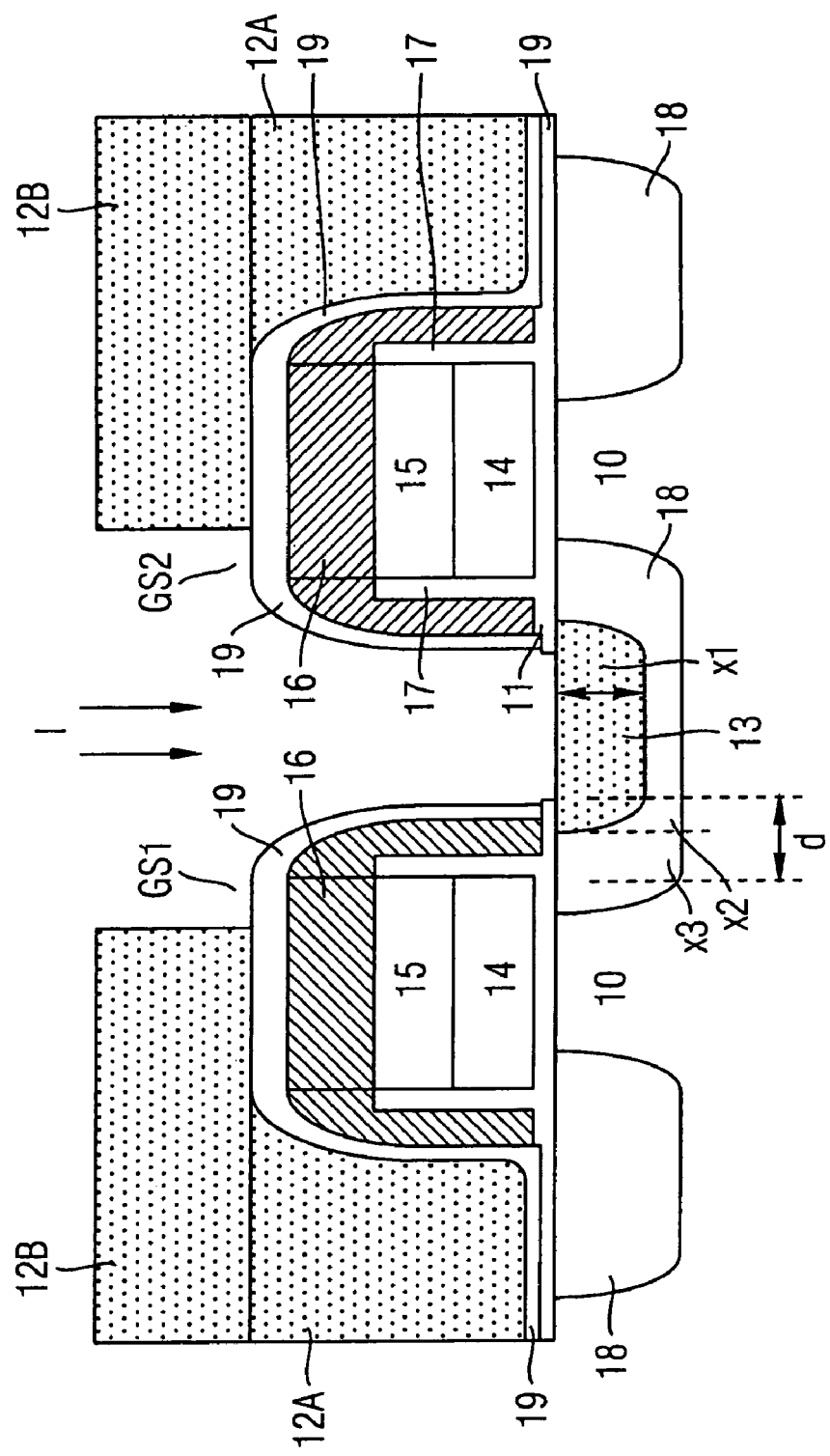
FIG. 3 shows a diagrammatic cross-sectional view of a customary semiconductor structure.

In accordance with FIG. 2B, in the case of the structure in accordance with FIG. 2A, a further implantation is then carried out, preferably at an angle a in the range of between 0° and 90° inclusive. This single-sided halo implantation 18 is of the p-type and has a dopant concentration which is at least a power of ten lower than the high-dose n-type doping of the section 13 in the substrate 10. The SWOX stripping, i.e. the reduction of the lateral extent of the sidewall oxide 17, 17', enables a spatial separation of the p-type halo implantation, since the latter requires a lateral "lead" over the highly n-doped section 13. The effectiveness of the p-doped section 18 (halo implant) is thereby increased. If the halo implantation is carried out at an angle $\alpha$ which differs from 0°, then the thinning of the sidewall oxide 17 to give 17' results on the one hand in an increase in the theoretically possible angle $\alpha_{max}$ before complete shading occurs during the implantation as a result of the adjacent gate stack structure, but primarily the effectiveness of the halo implantation also increases with larger $\alpha$.

In this way, it is possible to realize a selection transistor in the cell array of a DRAM with an extremely low connection resistance (on the source side), it being possible for a complete photolithography step with an additional photomask to be obviated.

Although the present invention has been described above on the basis of a predetermined exemplary embodiment, it is not restricted thereto, but rather can be modified in diverse ways.

Thus, in particular the doping types (n type; p type) are interchangeable. The materials mentioned (tungsten silicide, silicon nitride, . . . ) are also to be regarded as by way of example. Furthermore, the present invention is also conceivable in the fabrication of different semiconductor structures from the DRAM memory structures described.

What is claimed is:

1. Method for fabricating a semiconductor structure having a plurality of gate stacks on a semiconductor substrate, having the following steps:
   (a) applying the gate stacks to a gate dielectric above the semiconductor substrate;
   (b) forming a sidewall oxide on sidewalls of the gate stacks;
   (c) applying and patterning of mask on the semiconductor structure;
   (d) implanting a contact doping in a self-aligned manner with respect to the sidewall oxide of the gate stacks in regions not covered by the mask; and (e) after implanting the contact doping, reducing the sidewall oxide in its lateral extent in regions not covered by the mask for resulting in a thinned sidewall oxide.

2. Method according to claim 1, wherein the reduction of the extent of the lateral sidewall oxide for resulting in a thinned side wall oxide is followed by a further implantation of different doping.

3. Method according to claim 2, wherein the further doping is a p-type doping having a low concentration, preferably with a dopant concentration that is at least a power of ten lower than the contact doping concentration.

4. Method according to claim 2, wherein the further doping is a bit line halo doping implanted from a predetermined direction at a predetermined angle $\alpha$, preferably in the range of between about 0° and 30° inclusive.

5. Method according to claim 1, wherein the contact doping is implanted at a predetermined angle of $\alpha=0°$.

6. Method according to claim 1, wherein the contact doping is an n-type doping having a high concentration, for example having an implantation dose of about $10^{14}$ to $3 \cdot 10^{15}/cm^2$, preferably with arsenic.

7. Method according to claim 1, wherein a removal of the mask is followed by an implantation of a, preferably identical, dopant having a lower dopant concentration than that of the contact doping.

8. Method according to claim 1, wherein the gate stacks are applied approximately equidistantly with respect to one another, a storage capacitor being arranged alternately below every third or first adjacent gate in the semiconductor substrate in a cross-sectional plane.

9. Method according to claim 1, wherein the method is used for fabricating logic transistors.

10. Method according to claim 1, wherein the method is used for fabricating selection transistors, preferably of a DRAM.

11. Method according to claim 1, wherein the gate stacks are fabricated with a length of less than 200 nm.

12. Method according to claim 1, wherein the gate stacks are provided parallel and in strip-type fashion on the semiconductor substrate.

13. Method according to claim 1, wherein the gate stacks have a lower first layer made of polysilicon and an overlying second layer made of a metal silicide or a metal.

14. Method according to claim 1, wherein the gate stacks are created by carrying out an application and patterning of the first layer, the overlying second layer and a third layer arranged thereon on the gate dielectric.

15. Method according to claim 14, wherein the third layer has silicon nitride or oxide.

* * * * *